United States Patent
Mattsson

(10) Patent No.: US 7,432,794 B2
(45) Date of Patent: Oct. 7, 2008

(54) VARIABLE INTEGRATED INDUCTOR

(75) Inventor: Thomas Mattsson, Limhamn (SE)

(73) Assignee: Telefonaktiebolaget L M Ericsson (PUBL), Stockholm (SE)

( * ) Notice: Subject to any disclaimer, the term of this patent is extended or adjusted under 35 U.S.C. 154(b) by 633 days.

(21) Appl. No.: 11/214,076

(22) Filed: Aug. 29, 2005

(65) Prior Publication Data

US 2006/0033602 A1 Feb. 16, 2006

Related U.S. Application Data

(63) Continuation-in-part of application No. 10/919,130, filed on Aug. 16, 2004, now Pat. No. 7,151,430.

(51) Int. Cl.
*H01F 5/00* (2006.01)
*H01F 27/28* (2006.01)
*H01F 7/06* (2006.01)

(52) U.S. Cl. ............ 336/225; 336/220; 336/232; 29/602.1

(58) Field of Classification Search .......... 336/225, 336/200, 232, 223; 29/602.1, 605–606
See application file for complete search history.

(56) References Cited

U.S. PATENT DOCUMENTS

| | | | |
|---|---|---|---|
| 4,816,784 A * | 3/1989 | Rabjohn | 333/24 R |
| 5,872,489 A * | 2/1999 | Chang et al. | 331/179 |
| 5,912,596 A * | 6/1999 | Ghoshal | 331/117 R |
| 5,952,893 A * | 9/1999 | Ghoshal | 331/108 C |
| 6,255,913 B1 | 7/2001 | Wang | |
| 6,437,653 B1 | 8/2002 | Cruz et al. | |
| 6,549,096 B2 | 4/2003 | Groves et al. | |
| 6,577,219 B2 * | 6/2003 | Visser | 336/200 |
| 6,720,835 B2 * | 4/2004 | Fujita | 331/117 R |
| 6,885,275 B1 * | 4/2005 | Chang | 336/200 |
| 2005/0068146 A1 * | 3/2005 | Jessie | 336/200 |

FOREIGN PATENT DOCUMENTS

| | | |
|---|---|---|
| WO | WO98/05048 | 2/1998 |
| WO | WO2004/012213 | 2/2004 |

* cited by examiner

*Primary Examiner*—Anh T Mai
(74) *Attorney, Agent, or Firm*—Michael Cameron

(57) ABSTRACT

A variable integrated inductor is described herein which has an inductance value that can be switched between two or more values. In the preferred embodiment, the variable integrated inductor includes a multi-loop primary inductor which is electromagnetically coupled to a pair of secondary inductors. The secondary inductors are connected to one another to form a closed circuit within which the secondary inductors have a changeable topology that can be switched between a series connection and a parallel connection in order to change an inductance value which is output by the multi-loop primary inductor. In one application, the variable integrated inductor is used in a voltage controlled oscillator (VCO) which is of the type that can be used in a multi-band RF radio transceiver (e.g., wireless communication device). In other applications, the variable integrated inductor can be used in a tuned amplifier load, an impedance matching network, a digitally controlled oscillator or any other type of frequency selective LC-network.

21 Claims, 7 Drawing Sheets

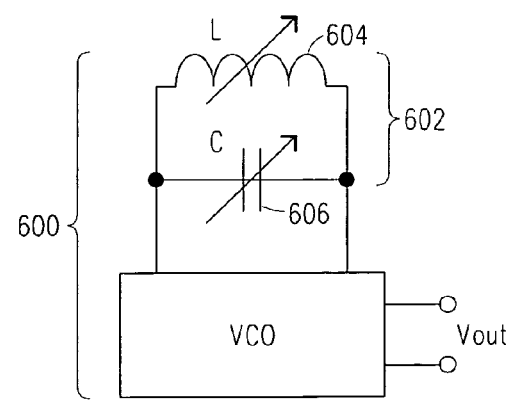
FIG. 6
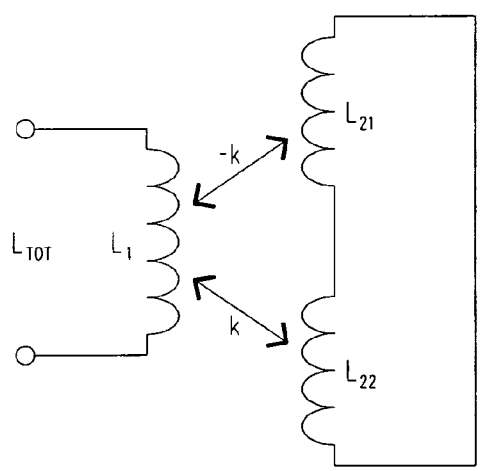 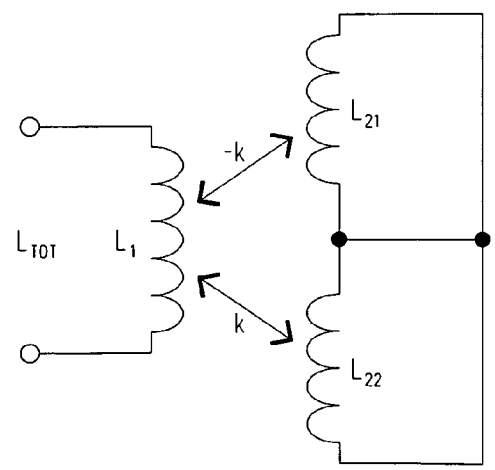
FIG. 7          FIG. 8

VARIABLE INTEGRATED INDUCTOR

CROSS REFERENCE TO CO-PENDING APPLICATION

This application is a continuation-in-part application of U.S. patent application Ser. No. 10/919,130, filed Aug. 16, 2004 now U.S. Pat. No. 7,151,430. The contents of this application are incorporated by reference herein.

BACKGROUND OF THE INVENTION

1. Field of the Invention

The present invention relates to a variable integrated inductor which has an inductance value that can be switched between two or more values. In one application, the variable integrated inductor is used in a voltage controlled oscillator (VCO) which is of the type that can be used in a multi-band RF radio transceiver (e.g., wireless communication devices, such as mobile telephones, pagers, laptop computers, personal digital assistants (PDAs) and the like). In other applications, the variable integrated inductor can be used in a tuned amplifier load, an impedance matching network, a digitally controlled oscillator or any type of frequency selective LC-network.

2. Description of Related Art

Referring to FIG. 1 (PRIOR ART), there is a block diagram that illustrates the basic components of a traditional direct conversion multi-band radio transceiver 100 (e.g., wireless communication device 100). The multi-band radio transceiver 100 shown includes an antenna 102, a transmit/receive (T/R) unit 104, a receive path 106, a transmit path 108 and a base-band signal processing unit 110. The receive path 106 includes a mixer 112 that is used together with a voltage controlled oscillator (VCO) 114 to down-convert a RF frequency signal, which is received by the antenna 102, to a lower frequency that is suitable for further signal processing in the base-band signal processing unit 110. The transmit path 108 includes a mixer 116 that is used together with a VCO 118 to up-convert a base-band signal, which is received from the base-band signal processing unit 110, to a higher frequency before it is transmitted by the antenna 102. Since, the RF frequency ($f_{RF}$) of the received signal and the transmitted signal can vary over a very wide range (more than a factor of 2), the multi-band transceiver 100 requires that both VCOs 114 and 118 be tunable over a wide frequency range.

This type of architecture for multi-band radio transceiver 100 has worked well in the past. However, today integrated radio transceiver solutions are being required which can cover more and more frequency bands to support more multi-band and multi-standard radio architectures. This expanded functionality has been difficult to meet because the VCOs 114 and 118 shown in FIG. 1 have a limited tuning range. A discussion is provided next to explain why the VCOs 114 and 118 have a limited tuning range.

The VCOs 114 and 118 have an oscillating frequency ($f_o$) which is set by a LC resonator circuit 120 that contains a fixed inductor 121 and a variable capacitor 123 which are connected in parallel. The oscillating frequency ($f_o$) is given by following equation:

$$f_o = \frac{1}{2\pi \cdot \sqrt{L \cdot C}} \qquad \text{Equation No. 1}$$

Because, the value of the inductor 121 is fixed this means that the tuning range of the LC resonator circuit 120 is limited to the capacitance ratio that can be achieved by adjusting the variable capacitor 123 (i.e. varicap 123 and capacitance switch 123). The limited tuning range of the LC-network 120 is not only a problem with multi-band radio transceivers 100. It is also a problem with other types of frequency selective LC-networks that can be, for example, used in tuned amplifier loads and impedance matching networks. A number of solutions which have been used in the past to address this problem are described next with respect to FIGS. 2-5.

Referring to FIG. 2 (PRIOR ART), there is a block diagram of a dual VCO 200 which has two VCOs 202a and 202b that are both connected to a multiplexer 204. Each VCO 202a and 202b has a LC resonator circuit 206a and 206b which contains a fixed inductor 205 and a variable capacitor 207 that are connected to one another in parallel. In this case, the dual VCO 200 has a total frequency range of $V_{out}$ that is made up of two sub-ranges of $V_{out1}$ and $V_{out2}$ which are outputted by VCOs 202a and 202b. Although, the dual VCO 200 is relatively easy to implement, it utilizes more than twice the silicon area than is used to make the VCO 114 (for example) shown in FIG. 1. This is not desirable.

Referring to FIG. 3 (PRIOR ART), there is a block diagram of a VCO 300 which is connected to a divider 302. The VCO 300 has a LC resonator circuit 304 which contains a fixed inductor 305 and a variable capacitor 307 that are connected to one another in parallel. The addition of the divider 302 at the output of the VCO 300 where the division ratio can be set to different integer values for different output frequency bands effectively decreases the tuning range requirements on the VCO 300. However, the addition of the divider 302 causes a significant increase the current consumption, especially if the phase noise requirements are stringent. And, the addition of the divider 302 increases the total area used on the chip. Moreover, with the addition of the divider 302 it is often difficult to generate quadrature output signals for divider ratios that are not multiples of 2. None of these characteristics are desirable.

Referring to FIG. 4 (PRIOR ART), there is a block diagram of a complex feed-back frequency generation scheme that has been used to implement a fractional division of the output signal of a VCO 400. In this scheme, the VCO 400 has a LC-type resonator circuit 402 which contains a fixed inductor 403 and a variable capacitor 405 that are connected to one another in parallel. And, the VCO's output signal is input into a mixer 404 which mixes that signal with a signal that passed through the mixer 404 and was divided by an integer N in a divider 406. The drawbacks of this scheme are that it consumes more current and takes up more space on the chip than anyone of the previous solutions shown in FIGS. 2-3.

Referring to FIG. 5 (PRIOR ART), there is a block diagram of a complex feed-forward frequency generation scheme that has also been used to implement a fractional division of the output signal of a VCO 500. In this scheme, the VCO 500 has a LC resonator circuit 502 which contains a fixed inductor 503 and a variable capacitor 505 that are connected to one another in parallel. And, the VCO's output signal is input into a mixer 504 and a divider 506. The divider 506 functions to divide the output signal by an integer N and then input the divided signal into the mixer 504. The mixer 504 then mixes both the original output signal and the divided output signal and outputs signal $V_{out}$. This scheme has the same drawbacks as the feed-back scheme shown in FIG. 4 in that it consumes more current and takes up more space on the chip than anyone of the previous solutions shown in FIGS. 2-3.

Accordingly, it can be seen that there has been and is a need for a new solution which can be used to increase the tuning range of a VCO. This new solution should not suffer from the aforementioned shortcomings and drawbacks that are associated with the traditional solutions. The variable integrated inductor of the present invention is such a solution.

BRIEF DESCRIPTION OF THE INVENTION

The present invention includes a variable integrated inductor which has an inductance value that can be switched between two or more values. In the preferred embodiment, the variable integrated inductor includes a multi-loop primary inductor which is electromagnetically coupled to a pair of secondary inductors. The secondary inductors are connected to one another to form a closed circuit within which the secondary inductors have a changeable topology that can be switched between a series connection and a parallel connection in order to change an inductance value which is output by the multi-loop primary inductor. In one application, the variable integrated inductor is used in a voltage controlled oscillator (VCO) which is of the type that can be used in a multi-band RF radio transceiver (e.g., wireless communication device). In other applications, the variable integrated inductor can be used in a tuned amplifier load, an impedance matching network, a digitally controlled oscillator or any other type of frequency selective LC-network.

BRIEF DESCRIPTION OF THE DRAWINGS

A more complete understanding of the present invention may be had by reference to the following detailed description when taken in conjunction with the accompanying drawings wherein:

FIG. 6 is a block diagram that illustrates a VCO that has a LC resonator circuit which includes a variable integrated inductor and a variable capacitor in accordance with the present invention;

FIG. 7 is a schematic of the variable integrated inductor shown in FIG. 6 in which a primary inductor is electromagnetically coupled to a pair of secondary inductors and the secondary inductors are connected in series in accordance with the present invention;

FIG. 8 is a schematic of the variable integrated inductor shown in FIG. 6 in which the primary inductor is electromagnetically coupled to a pair of secondary inductors and the secondary inductors are connected in parallel in accordance with the present invention;

DETAILED DESCRIPTION OF THE DRAWINGS

Figure 1:
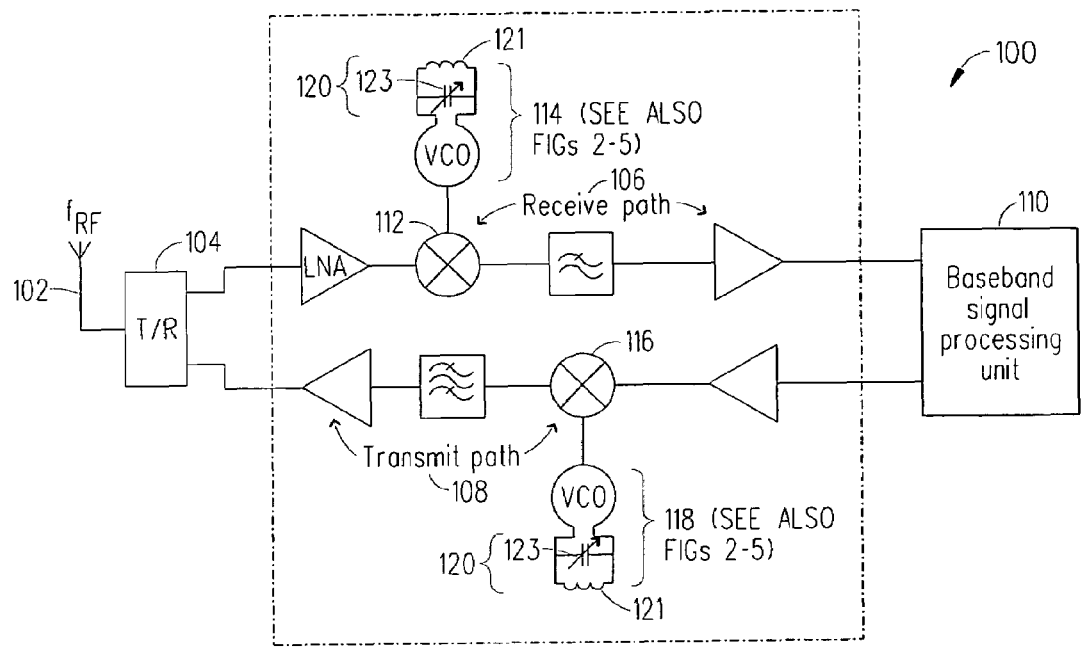
FIG. 1 (PRIOR ART) is a block diagram that illustrates the basic components of a traditional multi-band radio transceiver.
Figure 2:
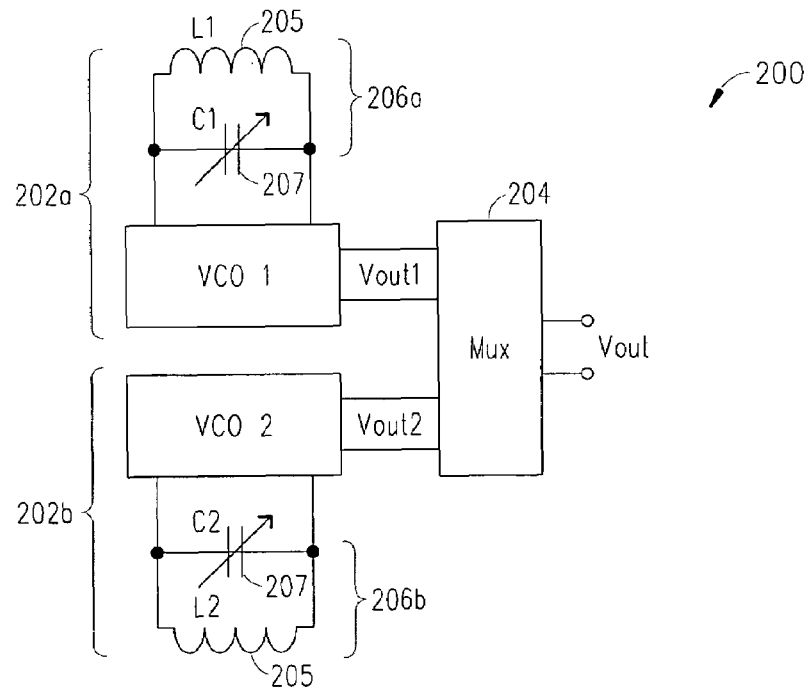
FIG. 2 (PRIOR ART) is a block diagram that illustrates one type of VCO that could be used in the multi-band radio transceiver shown in FIG. 1.
Figure 3:
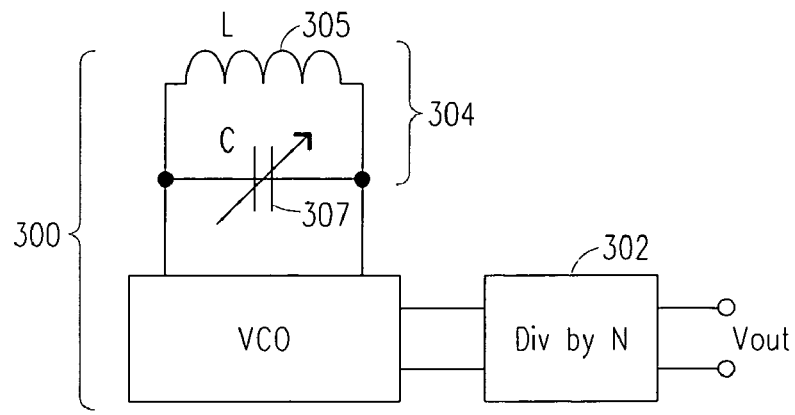
FIG. 3 (PRIOR ART) is a block diagram that illustrates another type of VCO that could be used in the multi-band radio transceiver shown in FIG. 1.
Figure 4:
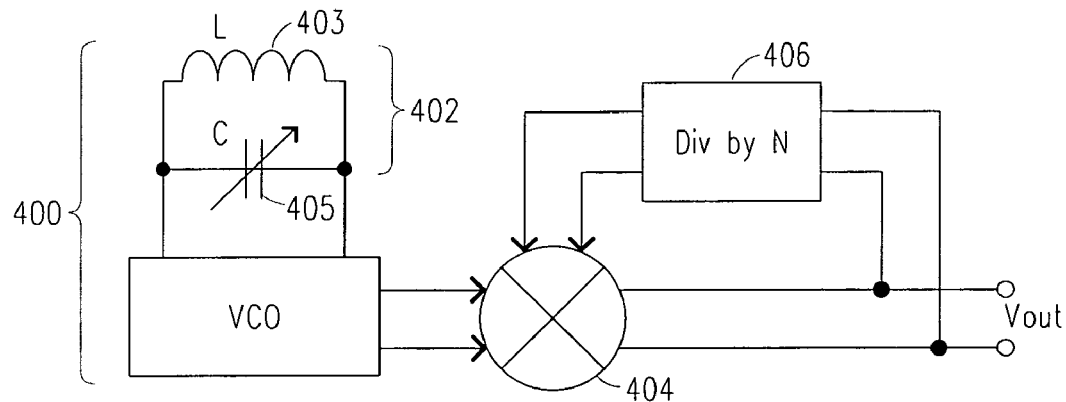
FIG. 4 (PRIOR ART) is a block diagram that illustrates yet another type of VCO that could be used in the multi-band radio transceiver shown in FIG. 1.
Figure 5:
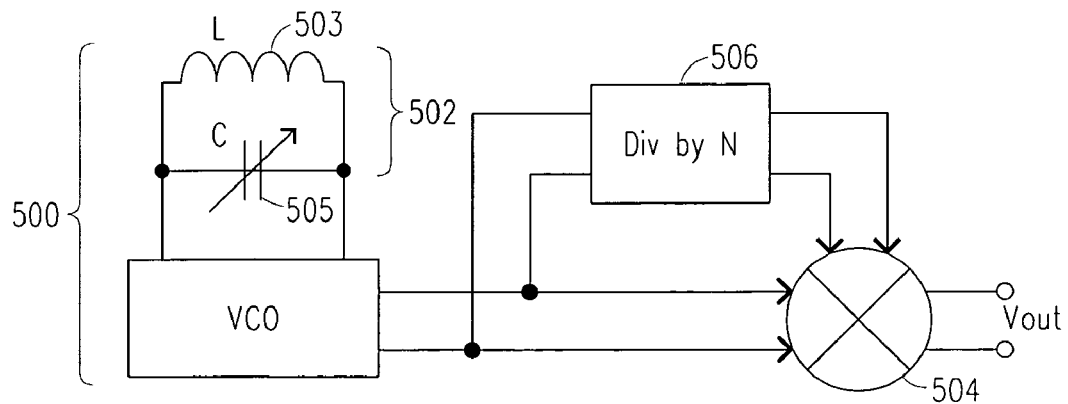
FIG. 5 (PRIOR ART) is a block diagram that illustrates still yet another type of VCO that could be used in the multi-band radio transceiver shown in FIG. 1.

Referring to FIG. 6, there is a block diagram illustrating a VCO 600 that has a LC resonator circuit 602 which includes a variable integrated inductor 604 (present invention) and a variable capacitor 606. The variable integrated inductor 604 implements a unique inductive switching technique which is described below that enables it's inductance to be switched between two or more values. As a result, the VCO 600 that uses both the variable integrated inductor 604 and the variable capacitor 606 has a tuning range which can be extended by utilizing both inductive switching and capacitive switching (see Equation No. 1). In the past, this extended tuning range was not possible, because the traditional VCO 114 (for example) had a tuning range that could be changed by using only capacitive switching (via the variable capacitor 123) since the inductor 121 was fixed (see FIG. 1).

The variable integrated inductor 604 implements this unique inductive switching technique by adding a number of secondary inductors in the same chip area as a primary inductor (see FIGS. 10-13). The secondary inductors are not physically connected to the primary inductor but instead are electromagnetically coupled to the primary inductor. And, the secondary inductors themselves can be connected to one another in different configurations/topologies so one can change the influence that the secondary inductors have on the primary inductor. In particular, one can switch the configuration/topology of the secondary inductors and change a value of the total inductance that is output by the primary inductor.

It is not a simple task to add new components like the secondary inductors to an inductor because those new components introduce new parasitic elements that can degrade the quality factor of the inductor. To avoid this problem, the preferred embodiment of the present invention uses two secondary inductors $L_{21}$ and $L_{22}$ that are electromagnetically coupled and not physically coupled to a primary inductor $L_1$ (see FIGS. 7-8). The two secondary inductors $L_{21}$ and $L_{22}$ should have identical inductances and they should have identical couplings to the primary inductor $L_1$. In addition, the two secondary inductors $L_{21}$ and $L_{22}$ should have coupling coefficients k with opposite signs. In this way, the resulting equivalent inductance of the three electromagnetically coupled structures $L_1$, $L_{21}$ and $L_{22}$ depends on how the two secondary devices $L_{21}$ and $L_{22}$ are connected to each other.

If the two secondary inductors $L_{21}$ and $L_{22}$ are connected in series as depicted in FIG. 7, then the effects of the two secondary inductors $L_{21}$ and $L_{22}$ cancel each other out due to the opposite signs of the coupling coefficients k and −k. In this case, no current will flow on the side which has the two secondary inductors $L_{21}$ and $L_{22}$ and the inductance and Q-factor of the primary inductor $L_1$ will remain unaffected as indicated by the following equation:

$$L_{TOT} = L_1 \qquad \text{Equation No. 2}$$

However, when the two secondary inductors $L_{21}$ and $L_{22}$ are connected in parallel as depicted in FIG. 8, then there is no longer a cancellation effect. The resulting inductance value of the primary inductor $L_1$ will decrease to a new value $L_{TOT}$ that depends on the magnitude of the coupling coefficient k as indicated in the following equation:

$$L_{TOT} = L_1 \cdot (1 - 2 \cdot k^2) \qquad \text{Equation No. 3}$$

In this topology, the overall Q-factor of the variable integrated inductor 604 will also decrease due to the fact that the loss resistance is not reduced by the same amount as the inductance value. As can be seen in FIGS. 7 and 8, the two secondary inductors $L_{21}$ and $L_{22}$ are always connected to one another to form a closed circuit it is the only topology within this closed circuit that can be changed by connecting them in series or parallel.

In the preferred embodiment, the integrated inductors $L_1$, $L_{21}$ and $L_{22}$ are implemented as metal traces on top of a semiconductor substrate (chip). All of the important performance parameters like the inductance value, the Q-factor, and the electromagnetic coupling to other metal structures are defined by the geometric properties of the inductor layout together with the material properties of the substrate. As such, it is important to properly size and layout the metal traces which are used to make the integrated inductors $L_1$, $L_{21}$ and $L_{22}$. A description is provided next about some different layouts which can be used to make the integrated inductors $L_1$, $L_{21}$ and $L_{22}$.

Figure 9:
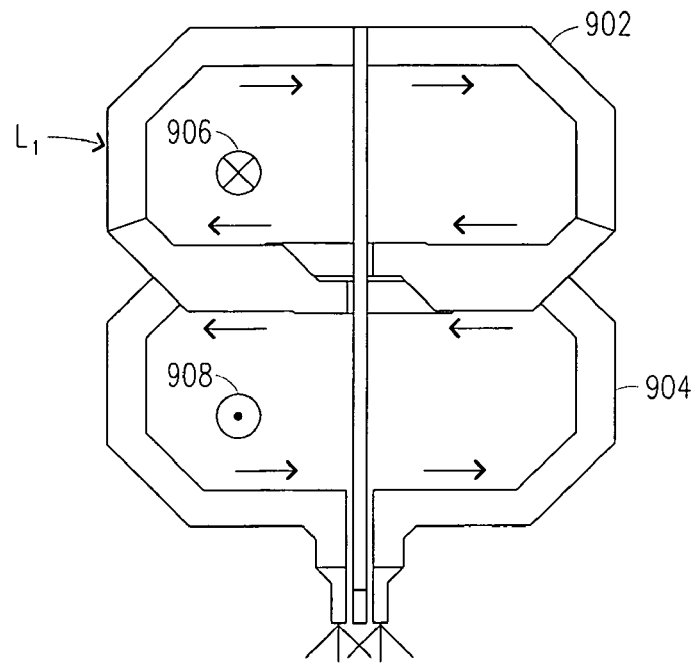
FIG. 9 is a diagram that illustrates a single-turn figure 8 shaped primary inductor which can be used along with secondary inductors (not shown) to make the variable integrated inductor in accordance with the present invention.

Referring to FIG. 9, there is illustrated a block diagram that shows a layout of a single-turn figure 8 shaped primary inductor $L_1$. In this example, the primary inductor $L_1$ has the form of a single-turn figure 8 shaped structure with an upper loop 902 and a lower loop 904. By virtue of the figure 8 shape, current in the upper loop 902 travels in a direction (e.g., clockwise, see arrows) that is opposite to current in the lower loop 904 (e.g., counterclockwise, see arrows). As a result, the figure-8 geometry has the advantage that the magnetic fields 906 and 908 emitted from the two sub-loops 902 and 904 have opposite directions. And, this means that the magnetic fields 906 and 908 which emanate at a certain distance from the primary inductor $L_1$ tend to counteract each other so as to reduce the far field effect that the primary inductor $L_1$ can have on other components (for more details about this advantage see co-pending U.S. patent application Ser. No. 10/919, 130). Another advantage of this symmetrical layout for the primary inductor $L_1$ is that it is well suited for implementing the inductive switching technique of the present invention as discussed next.

Figure 10:
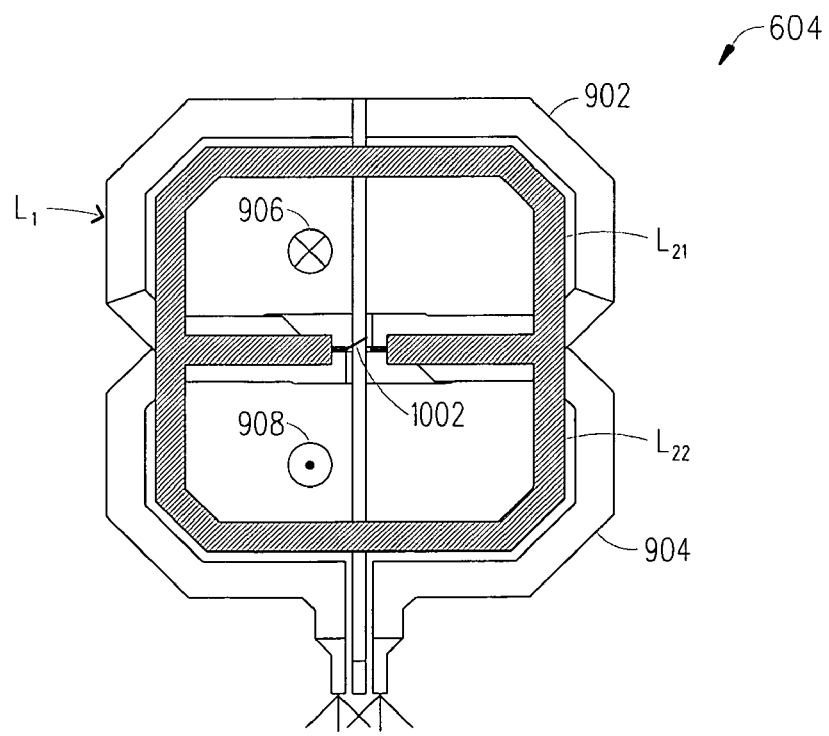
FIG. 10 is a block diagram of an exemplary variable integrated inductor which has a single-turn figure 8 shaped primary inductor that is electromagnetically coupled to two secondary inductors which are connected to one another in series in accordance with the present invention.

Referring to FIG. 10, there is illustrated a block diagram of an exemplary variable integrated inductor 604 that shows two secondary inductors $L_{21}$ and $L_{22}$ that are electromagnetically coupled to the single-turn figure 8 shaped primary inductor $L_1$ in accordance with the present invention. A switch 1002 in the center is left open resulting in a closed circuit series connection of the two secondary inductors $L_{21}$ and $L_{22}$. For instance, the switch 1002 can be a large metal oxide semiconductor (MOS) transistor 1002 that can be controlled by software. The full layout symmetry between the inductors $L_1$, $L_{21}$ and $L_{22}$ guarantees that the coupling coefficients k of the second inductors $L_{21}$ and $L_{22}$ are identical in magnitude. And, the symmetrical figure-8 shape of the primary inductor $L_1$ automatically ensures that the coupling coefficients k of the secondary inductors $L_{21}$ and $L_{22}$ have opposite signs. This is due to the fact that the primary inductor $L_1$ has two sub-loops 902 and 904 which have opposing magnetic fields 906 and 908. As a result, the variable integrated inductor 604 in this configuration functions like the circuit shown in FIG. 7 and the total inductance $L_{TOT}$ is equal to the inductance of the primary inductor $L_1$.

Figure 11:
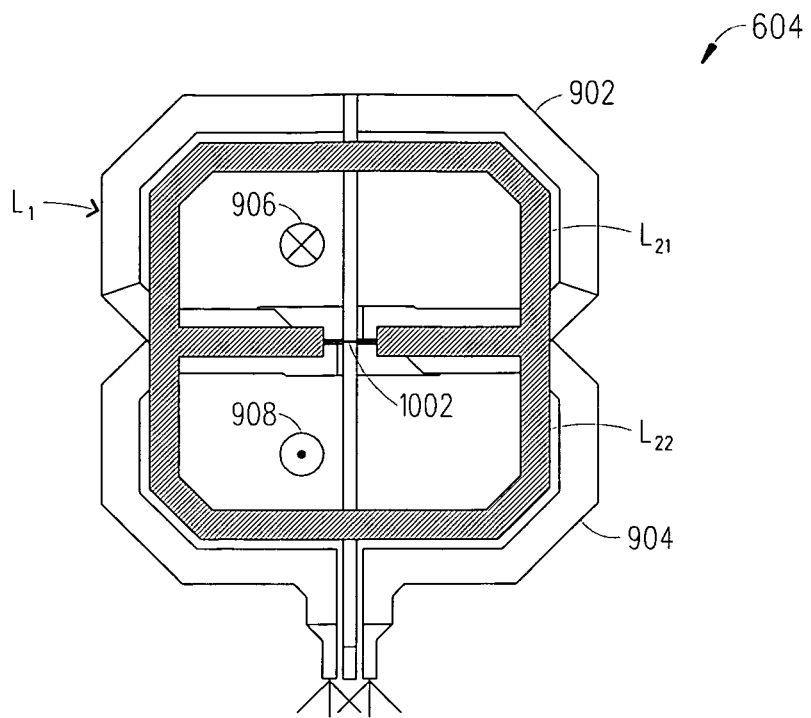
FIG. 11 is a block diagram of an exemplary variable integrated inductor which has a single-turn figure 8 shaped primary inductor that is electromagnetically coupled to two secondary inductors which are connected to one another in parallel in accordance with the present invention.

Referring to FIG. 11, there is illustrated a block diagram of the exemplary variable integrated inductor 604 shown in FIG. 10 where the switch 1002 is closed so the secondary inductors $L_{21}$ and $L_{22}$ are connected in parallel. Again, the full layout symmetry between the inductors $L_1$, $L_{21}$ and $L_{22}$ guarantees that the coupling coefficients k of the second inductors $L_{21}$ and $L_{22}$ are identical in magnitude. And, the geometries of the inductors $L_1$, $L_{21}$ and $L_{22}$ have not changed so the secondary inductors $L_{21}$ and $L_{22}$ still have coupling coefficients k with opposite signs. As a result, the variable integrated inductor 604 in this configuration functions like the circuit shown in FIG. 8 and the total inductance $L_{TOT}$ is reduced in accordance with Equation No. 3.

Figure 12:
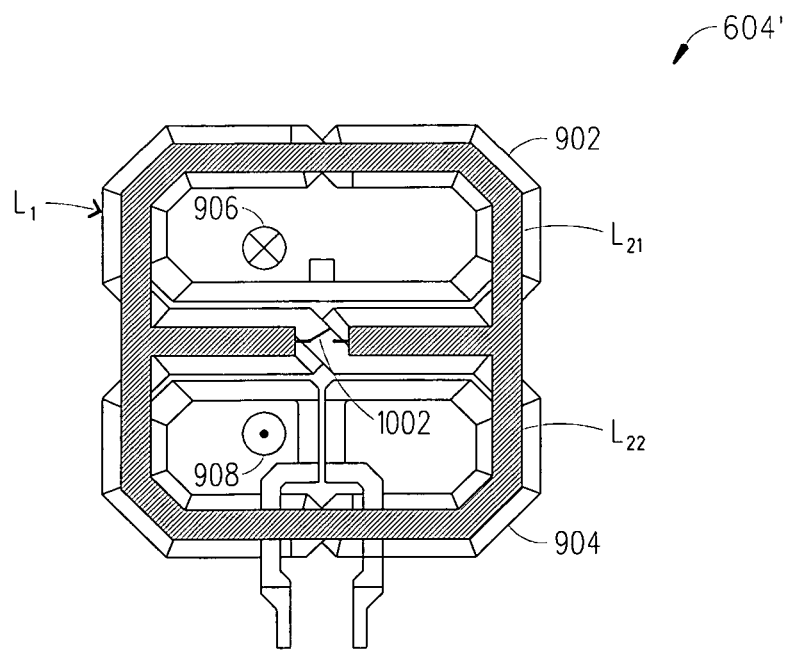
FIG. 12 is a block diagram of an exemplary variable integrated inductor that has a double-turn figure 8 shaped primary inductor that is electromagnetically coupled to two secondary inductors in accordance with the present invention.

Referring to FIG. 12, there is illustrated a block diagram of an exemplary variable integrated inductor 604' that has two secondary inductors $L_{21}$ and $L_{22}$ which are electromagnetically coupled to the double-turn figure 8 shaped primary inductor $L_1$ in accordance with another embodiment of the present invention. The double-turn figure 8 shaped primary inductor $L_1$ is very similar to the single-turn figure 8 shaped primary inductor $L_1$ shown in FIGS. 10-11 in that it has an upper loop 902 and a lower loop 904. However, the double-turn figure 8 shaped primary inductor $L_1$ that has 2 turns has a lower Q-factor and is structurally smaller for the same inductance value when compared to the single-turn figure 8 shaped primary inductor $L_1$ shown in FIGS. 10-11. The switching mechanism 1002 can be the same as the one shown in FIGS. 10-11.

In both embodiments of the variable integrated inductor 604 and 604', it should be noted that depending on the actual layout of the inductors $L_1$, $L_{21}$ and $L_{22}$, the inductance values of the connected secondary inductors $L_{21}$ and $L_{22}$ might differ slightly between the series configuration and the parallel configuration. However, this is not a problem provided that the inductance values are equal $L_{21} = L_{22}$ between the two secondary inductors $L_{21}$, $L_{22}$ themselves.

Although one pair of secondary inductors $L_{21}$ and $L_{22}$ is shown and described above with respect to FIGS. 7-12, it is also possible to implement several pairs of secondary inductors which enables the primary inductor $L_1$ to output more than two inductance values. The use of multiple pairs of secondary inductors may be desirable since using inductive switches instead of capacitive switches for frequency tuning is probably less sensitive to differences in process parameters. This is because the inductive switches are closely linked to device geometry which can be more tightly controlled. For instance, the magnitude of the coupling coefficients k can be controlled by using laser-cutting tools to change the geometry (e.g., size, shape) of the secondary inductors relative to the primary inductor $L_1$. The laser-cutting tools can also be used to replace the MOS switch 1002 if one wants to perform a once for all tuning (trimming) of the variable integrated inductor 604 during production to compensate for process variations in other components that influence the VCO frequency.

Figure 13:
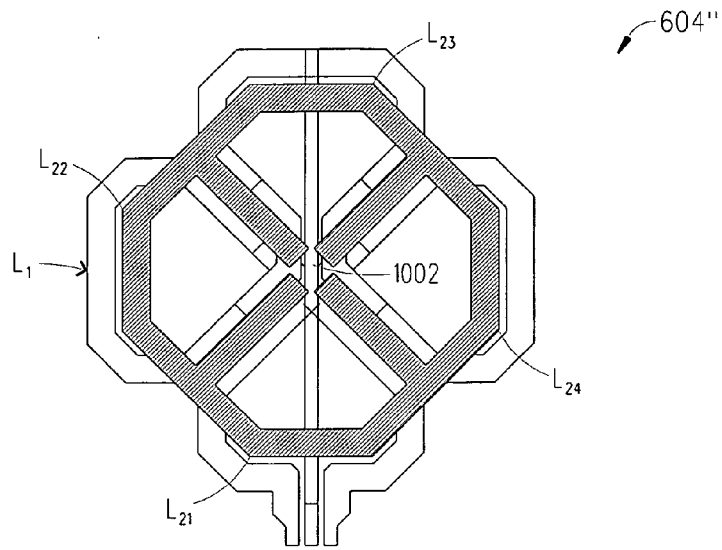
FIG. 13 is a block diagram of an exemplary variable integrated inductor that has a cloverleaf shaped primary inductor that is electromagnetically coupled to four secondary inductors in accordance with the present invention.

A large variety of geometries can be utilized for switched variable integrated inductors 604 which implement multiple pairs of secondary inductors provided that they can in a simple way support opposite signs for the various coupling coefficients k of the secondary inductors. One such example is shown in FIG. 13, this variable integrated inductor 604" has a cloverleaf shaped primary inductor $L_1$ and four secondary inductors $L_{21}$, $L_{22}$, $L_{23}$ and $L_{24}$. The four secondary inductors $L_{21}$, $L_{22}$, $L_{23}$, and $L_{24}$ are used for inductance switching where two of the secondary inductors $L_{21}$ and $L_{23}$ (for example) have positive coupling coefficients k and the other two secondary inductors $L_{22}$ and $L_{24}$ (for example) have negative coupling coefficients –k. The switching mechanism 1002 can be the same as the one shown in FIGS. 10-11.

As indicated above, the variable integrated inductors 604, 604' and 604" can be implemented in a wide variety of devices. For example, devices like tuned amplifier loads, impedance matching networks, a digitally controlled oscillator or other types of frequency selective LC-networks can benefit from incorporating and using the extended tuning range of the variable integrated inductors 604, 604' and 604". In addition, a multi-band radio transceiver 1400 like the one shown in FIG. 14 can benefit from the use of two variable integrated inductors 604, 604' and 604".

Figure 14:
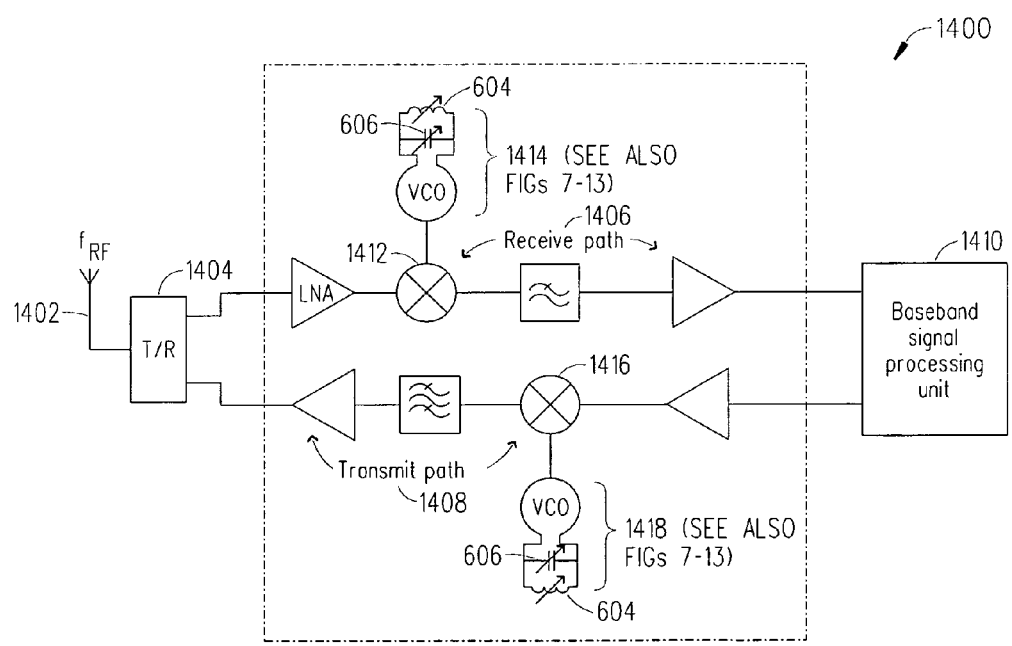
FIG. 14 is a block diagram that illustrates the basic components of a multi-band radio transceiver which incorporates two variable integrated inductors like the ones shown in FIGS. 6-12 in accordance with the present invention.

Referring to FIG. 14, there is a block diagram illustrating the basic components of the multi-band radio transceiver 1400 in accordance with the present invention. The multi-band radio transceiver 1400 (e.g., wireless communication device 1400) shown includes an antenna 1402, a transmit/receive (T/R) unit 1404, a receive path 1406, a transmit path 1408 and a base-band signal processing unit 1410. The receive path 1406 includes a mixer 1412 that is used together with a VCO 1414 to down-convert a RF frequency signal, which is received by the antenna 1402, to a lower frequency that is suitable for further signal processing in the base-band signal processing unit 1410. The transmit path 1408 includes a mixer 1416 that is used together with a VCO 1418 to up-convert a base-band signal, which is received from the base-band signal processing unit 1410, to a higher frequency before it is transmitted by the antenna 1402.

The multi-band radio transceiver 1400 has the same configuration as the traditional multi-band radio transceiver 100 shown in FIG. 1 except that the tuning ranges of the VCOs 1414 and 1418 are larger than the tuning ranges of the VCOs 114 and 118 used in the traditional multi-band radio transceiver 100. Again, the VCOs 1414 and 1418 have an extended tuning range because they can use a combination of both inductive switching (via the variable integrated inductor 604, 604' and 604") and capacitive switching (via the variable capacitor 606). In the past, this extended tuning range was not possible because the traditional VCOs 114 and 118 had a tuning range that could be changed by using only capacitive switching (via the variable capacitor 123) since the inductor 121 was fixed (see FIG. 1). For clarity, the description provided herein about the multi-band radio transceiver 1400 omits certain details about well known components that are not necessary to understand the present invention.

Another advantage associated with using the variable integrated inductors 604, 604' and 604" in the multi-band radio transceiver 1400 (or any device) is that there is less mutual EM coupling between the VCOs 1414 and 1418. This is because, each variable integrated inductor 604, 604' and 604" is symmetrical. And, since each variable integrated inductor 604, 604' and 604" consists of symmetrical multiple loops this means that each of them emit magnetic fields that tend to counteract themselves. As a consequence, two variable integrated inductors 604, 604' and 604" can be placed near each other and oriented in a way such that the induced current in one variable integrated inductor 604, 604' and 604" due to the magnetic field originating from the other variable integrated inductor 604, 604' and 604" is significantly reduced. For a more detailed discussion about this advantage and other advantages associated with using a symmetrical primary inductor, reference is made to the co-pending U.S. patent application Ser. No. 10/919,130.

Figure 15:
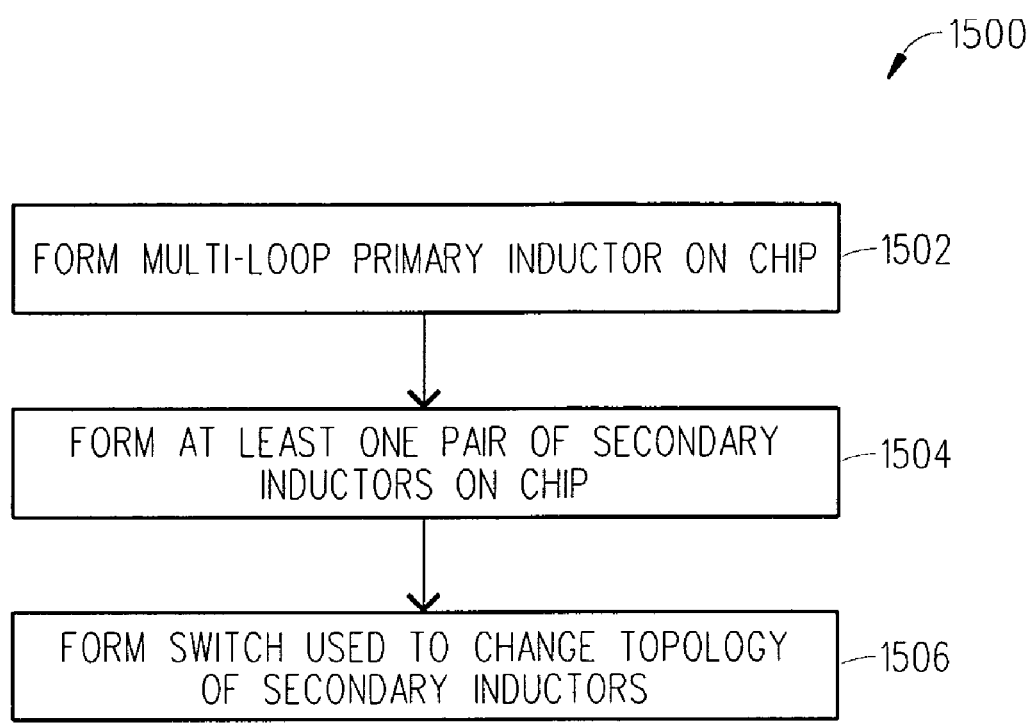
FIG. 15 is a flowchart illustrating the basic steps of a method for manufacturing the variable integrated inductor in accordance with the present invention.

Referring to FIG. 15, there is a flowchart that illustrates the basic steps of a method 1500 for manufacturing the variable integrated inductor 604, 604' and 604" in accordance with the present invention. Beginning at step 1502, a multi-loop primary inductor $L_1$ is formed by placing metal traces on a chip. At step 1504, one or more pairs of secondary inductors $L_{21}$ and $L_{22}$ (for example) are formed by placing metal traces on the chip. As discussed above, the secondary inductors $L_{21}$ and $L_{22}$ are electromagnetically coupled to the multi-loop primary inductor $L_1$. And, the secondary inductors $L_{21}$ and $L_{22}$ form a closed circuit which has a changeable topology that can be switched between a series connection and a parallel connection. At step 1506, a switch 1002 is formed on the chip. The switch 1002 is used to alter the changeable topology of the secondary inductors $L_{21}$ and $L_{22}$ and change an inductance value which is output by the multi-loop primary inductor $L_1$.

Following are some additional features and advantages associated with the present invention:

Using a switchable integrated inductor in the VCO resonator extends the frequency tuning range beyond the limit imposed by capacitive switches. This makes it possible to use a single VCO to cover more bands in a multi-band radio transceiver. Also, the chip area of an integrated VCO is already relatively large due to the inductor itself and a reduced number of VCOs means a substantial cost reduction for the transceiver chip.

The switchable integrated inductor has a inductance value that can be set to an arbitrary value (within certain limits) by changing the coupling coefficient K between the windings. The step is almost independent of process variations since it is determined mainly by geometrical parameters.

The secondary inductors are not galvanicly connected to the resonator circuit. This minimizes the parasitic effects and makes it easier to implement the switch element since one can apply the most suitable voltage to the secondary windings.

The inductive switching technique can be used for a large variety of inductor layouts and it's use will not take up much more chip area than is used by a traditional inductor.

The inductive switching technique can be applied so the inductor layouts will have reduced electromagnetic coupling to other conductors that are on-chip or off-chip.

The secondary inductors can introduce additional losses when they are in parallel connection in the low inductance state. And, as a consequence, the quality-factor of the inductor can drop and the phase noise performance of the VCO can be reduced. However, this can easily be compensated for by increased supply current in applications where the phase noise requirements are stringent.

In the event, that variations in the manufacturing process result in a VCO (which contains the variable integrated inductor) that has an oscillation frequency which is too low, then a production trimming of the inductors can be performed to increase the oscillation frequency to an acceptable value.

Although several embodiments of the present invention have been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

What is claimed is:

1. A variable integrated inductor, comprising:
   a multi-loop primary inductor; and
   a pair of secondary inductors, electromagnetically coupled to said multi-loop primary inductor, said secondary inductors are connected to one another to form a closed circuit within which said secondary inductors have a changeable topology that can be switched between a series connection and a parallel connection to change an inductance value output by said multi-loop primary inductor.

2. The variable integrated inductor of claim 1, wherein when said pair of secondary inductors have the series connection then there is no change in the inductance value output by said multi-loop primary inductor.

3. The variable integrated inductor of claim 1, wherein when said pair of secondary inductors have the parallel connection then there is a decrease in the inductance value output by said multi-loop primary inductor.

4. The variable integrated inductor of claim 1, wherein said pair of secondary inductors include one secondary inductor that has a predetermined inductance and a positive coupling coefficient k and another secondary inductor that has a predetermined inductance and a negative coupling coefficient −k.

5. The variable integrated inductor of claim 1, wherein said multi-loop primary inductor is a symmetric multi-loop primary inductor.

6. The variable integrated inductor of claim 1, wherein said multi-loop primary inductor is a single turn figure-8 shaped inductor that has two sub-loops of which the first sub-loop has a magnetic field in one direction and the second sub-loop has a magnetic field in an opposite direction.

7. The variable integrated inductor of claim 1, wherein said multi-loop primary inductor is a cloverleaf shaped inductor.

8. The variable integrated inductor of claim 1, wherein said multi-loop primary inductor is a two turn figure-8 shaped inductor.

9. The variable integrated inductor of claim 1, further comprising multiple pairs of secondary inductors which are used to increase a number of possible inductance values which can be output by said multi-loop primary inductor.

10. The variable integrated inductor of claim 1, wherein said multi-loop primary inductor and said pair of secondary inductors are used in a selected one of the following devices:
    a voltage controlled oscillator;
    a tuned amplifier load;
    a digitally controlled oscillator;
    an impedance matching network; and
    a frequency selective LC-network.

11. A method for manufacturing a switched integrated inductor, said method comprising the steps of:
    forming a multi-loop primary inductor on a chip;
    forming a pair of secondary inductors on the chip such that:
       said pair of secondary inductors are electromagnetically coupled to said multi-loop primary inductor; and
       said pair of secondary inductors form a closed circuit which has a switchable topology; and
    forming a switch on said chip, said switch is used to change the switchable topology of said pair of secondary inductors to either a series connection or a parallel connection to change an inductance value which is output by said multi-loop primary inductor.

12. The method of claim 11, wherein when said switch is in an open position then said pair of secondary inductors have the series connection which does not cause a change to the inductance value output by said multi-loop primary inductor.

13. The method of claim 11, wherein when said switch is in a closed position then said pair of secondary inductors have the parallel connection which causes a decrease in the inductance value output by said multi-loop primary inductor.

14. The method of claim 11, wherein said pair of secondary inductors include one secondary inductor that has a predetermined inductance and a positive coupling coefficient k and another secondary inductor that has a predetermined inductance and a negative coupling coefficient −k.

15. The method of claim 11, wherein said multi-loop primary inductor is a symmetric multi-loop primary inductor.

16. The method of claim 15, wherein said multi-loop primary inductor is a single turn figure-8 shaped inductor that has two sub-loops of which the first sub-loop has a magnetic field in one direction and the second sub-loop has a magnetic field in an opposite direction.

17. A multi-band radio transceiver, comprising:
    a receive path incorporating a first voltage controlled oscillator which includes:
       a first variable capacitor; and
       a first variable integrated inductor, wherein said first variable integrated inductor includes:
          a first multi-loop primary inductor; and
          a first pair of secondary inductors, electromagnetically coupled to said first multi-loop primary inductor, said first pair of secondary inductors are connected to one another to form a closed circuit within which said first pair of secondary inductors have a changeable topology that can be switched between a series connection and a parallel connection to change an inductance value output by said first multi-loop primary inductor; and
    a transmit path incorporating a second voltage controlled oscillator which includes:
       a second variable capacitor; and
       a second variable integrated inductor, wherein said second variable integrated inductor includes:
          a second multi-loop primary inductor; and
          a second pair of secondary inductors, electromagnetically coupled to said second multi-loop primary inductor, said second pair of secondary inductors are connected to one another to form a closed circuit within which said second pair of secondary inductors have a changeable topology that can be switched between a series connection and a parallel connection to change an inductance value output by said second multi-loop primary inductor.

18. The multi-band radio transceiver of claim 17, wherein said first variable integrated inductor has a symmetrical multi-loop layout which reduces electromagnetic coupling to said second variable integrate inductor and vice versa.

19. The multi-band radio transceiver of claim 17, wherein when one of said pairs of secondary inductors have the series connection then there is no change in the inductance value which is output by the corresponding multi-loop primary inductor.

20. The multi-band radio transceiver of claim 17, wherein when one of said pairs of secondary inductors have the parallel connection then there is a decrease in the inductance value which is output by the corresponding multi-loop primary inductor.

21. A wireless communication device, comprising:
a receive path incorporating a first voltage controlled oscillator which includes:
   a first variable capacitor; and
   a first symmetric variable integrated inductor, wherein said first symmetric variable integrated inductor includes:
      a first multi-loop primary inductor; and
      a first pair of secondary inductors, electromagnetically coupled to said first multi-loop primary inductor, said first pair of secondary inductors are connected to one another to form a closed circuit within which said first pair of secondary inductors have a changeable topology that can be switched between a series connection and a parallel connection to change an inductance value output by said first multi-loop primary inductor; and a transmit path incorporating a second voltage controlled oscillator which includes:
   a second variable capacitor; and
   a second symmetric variable integrated inductor, wherein said second symmetric variable integrated inductor includes:
      a second multi-loop primary inductor; and
      a second pair of secondary inductors, electromagnetically coupled to said second multi-loop primary inductor, said second pair of secondary inductors are connected to one another to form a closed circuit within which said second pair of secondary inductors have a changeable topology that can be switched between a series connection and a parallel connection to change an inductance value output by said second multi-loop primary inductor.

* * * * *